United States Patent [19]
Barr et al.

[11] Patent Number: 5,472,736
[45] Date of Patent: Dec. 5, 1995

[54] METHOD OF MAKING A BI-LEVEL COIL FOR A THIN FILM MAGNETIC TRANSDUCER

[75] Inventors: Ronald A. Barr, Mountain View; Jeffrey P. Hagen, Los Gatos, both of Calif.

[73] Assignee: Read-Rite Corporation, Milpitas, Calif.

[21] Appl. No.: 407,270

[22] Filed: Mar. 20, 1995

Related U.S. Application Data

[63] Continuation of Ser. No. 986,341, Dec. 7, 1992, abandoned, which is a continuation of Ser. No. 709,333, Pat. No. 5,173,826.

[51] Int. Cl.$^6$ .................................................. B05D 5/12
[52] U.S. Cl. ...................... 427/123; 427/130; 427/131; 427/132; 427/282; 427/307; 427/404; 430/97
[58] Field of Search ..................... 427/123, 130, 427/131, 132, 282, 307, 404; 430/97

[56] References Cited

U.S. PATENT DOCUMENTS

| | | | |
|---|---|---|---|
| 2,484,214 | 10/1949 | Ford et al. | 427/435 |
| 4,219,854 | 8/1980 | Church et al. | 360/123 |
| 4,639,289 | 1/1987 | Lazzari | 156/643 |
| 4,694,368 | 9/1987 | Bischoff et al. | 360/126 |
| 4,791,719 | 12/1988 | Kobayashi et al. | 29/603 |
| 4,860,140 | 8/1989 | Momata et al. | 360/127 |
| 5,087,332 | 2/1992 | Chen | 205/135 |
| 5,173,826 | 12/1992 | Bischoff | 360/126 |

*Primary Examiner*—Benjamin Utech
*Attorney, Agent, or Firm*—Nathan N. Kallman

[57] ABSTRACT

A method of manufacturing a thin film magnetic transducer in which a layer of photoresist material is used to pattern the turns of a bi-level electrical coil. The thickness of the photoresist layer is increased to the maximum height of the bi-level coil. A multi-turn spiral type rectangular trench is formed to define the pattern of the coil structure. In the first coil plating step, a first coil section is plated in the trench to approximately the midpoint of its height. The layer of the resist material is then cured and a blocking mask is deposited over the portion of the first coil section that is not to be further increased in height. The area of the coil that is not blocked by the blocking mask is again plated using the initial pattern until each partial turn in the unblocked section reaches the top of the groove. The cured resist material and the blocking mask are then removed. Since both plating steps rely on the same pattern that has been formed in the photoresist material, alignment errors and mask tolerance problems experienced with prior art methods are virtually eliminated, thereby resulting in substantially higher yields and lower manufacturing costs.

2 Claims, 2 Drawing Sheets

METHOD OF MAKING A BI-LEVEL COIL FOR A THIN FILM MAGNETIC TRANSDUCER

This is a continuation of Ser. No. 986,341, filed Dec. 7, 1992, now abandoned, which is a continuation of Ser. No. 709,333, filed Jun. 3, 1991, now U.S. Pat. No. 5,173,826. The subject matter of the application is incorporated herein by reference.

FIELD OF THE INVENTION

This invention relates to thin film magnetic transducers and in particular to a process of manufacturing a thin film transducer having a bi-level read-write electrical coil.

BACKGROUND OF THE INVENTION

As is well known in the art, thin film magnetic heads used with data storage apparatus, such as disk files, typically comprise a magnetic yoke formed with two pole pieces designated as P1 and P2 and an electrically conductive coil structure disposed between the pole pieces. The tips of the pole pieces define a transducing gap for coaction with a magnetic medium, such as a magnetic disk that rotates close to the transducing gap of the head. The pole pieces interconnect at a back closure. A polished ceramic substrate having a thin insulation layer thereon, which is lapped and polished, supports the different layers which are deposited to form the magnetic transducer. To prevent electrical shorting, insulating layers are provided between the coil structure and pole pieces.

During operation in the recording mode of a data storage device, such as a disk drive, current representing data signals is directed to the conductive coils. The current is converted to magnetic flux signals by the magnetic head or transducer, and the signals are recorded on the disk as it rotates adjacent to the nonmagnetic transducing gap. During the readout or playback mode, as the magnetic disk is rotated past the head, the recorded magnetic flux signals are sensed and are converted to current that flows through the conductive coils. U.S. Pat. No. 4,694,368 which issued to Bischoff et al. on Sep. 15, 1987 describes a process of making a thin film magnetic head or transducer.

A significant problem that is experienced with thin film magnetic heads is the relatively high coil resistance or transducer resistance. The power $I^2R$ (where I is current and R is resistance) that is dissipated during the recording process is determined by the value of coil resistance Thus the higher the resistance, of the head coil structure the higher will be the power dissipation and the greater the extent of thermal expansion of the components of the recording head and the recording apparatus. Thermal expansion adversely affects the recording operation. In addition, during the readout mode, the amount of thermal noise that is generated depends upon the level of coil resistance. This thermal noise is generated at the transducer level and will be amplified in the storage apparatus, resulting in an undesirable reduction of the signal-to-noise ratio of the recording process.

An important factor to be considered in the design of a recording head is the number of coil windings or turns which are used and the overall length of the coil structure. The number of coil turns and the total length of the coil structure determine the overall resistance of the coil structure and signal output. One parameter that is important in read-write coil design is the overall resistance of the coil. Coil resistance is a function of the average cross-sectional dimensions of the coil as well as the coil length. Lower resistance allows more write current to be carried without increasing the heat being generated in the coil. Since thin film transducers are manufactured in layers using various materials and deposition techniques, it is desirable that the depth of the coil layer that is disposed intermediate the layers that contain the leg members of the yoke, be kept short to avoid problems that arise in depositing thick layers of magnetic material.

In the prior art, the process of manufacturing a bi-level coil require depositing one coil and then depositing a second coil on the first coil so that each turn of the second coil is aligned exactly with the corresponding turns of the first coil. The alignment of the coils in the two layers becomes very critical and is difficult to monitor during the process to determine if the various tolerances involved with the masks and associated processing have combined to introduce problems that are not detectable until after the transducer is completed. The present invention is directed to a process of manufacturing a thin film magnetic transducer which avoids the above-described problems.

SUMMARY OF THE INVENTION

An object of this invention is to provide a thin film head having a reduced coil resistance without degrading the performance of the magnetic head.

Another object of this invention is to provide a thin film head that affords a relatively high signal output without any complex modification in the head structure or manufacturing process.

According to this invention, a thin film magnetic head comprises pole piece layers P1 and P2 with a bi-level coil structure formed between the pole pieces. During production of the magnetic head, a groove is patterned in a photoresist layer deposited over the first pole piece P1. A full area coil section is formed preferably by plating conductive material such as copper or gold in the lower level of the groove. A partial coil section is formed by plating conductive material above a portion of the full area coil section using a blocking mask. Insulation material is provided to avoid electrical shorting between the coil structure and the magnetic pole pieces P1 and P2. Since both plating steps rely on the same pattern that has been formed in the photoresist material, alignment errors and resulting problems of the prior art methods are eliminated resulting in substantially higher yields and hence lower manufacturing costs.

BRIEF DESCRIPTION OF THE DRAWINGS

The invention will be described with reference to the drawing in which.

DETAILED DESCRIPTION OF THE INVENTION

Figure 1:
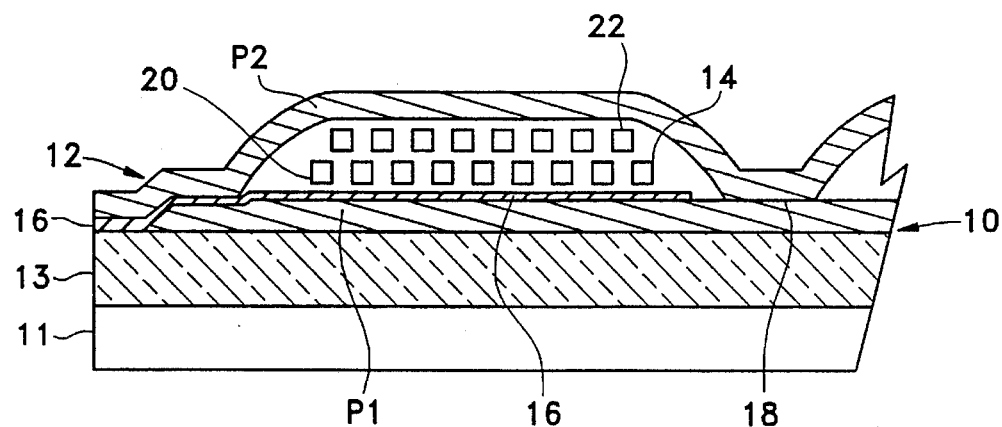
FIG. 1 is a cross-sectional elevation view, partly broken away, illustrating the bi-level magnetic transducer of this invention.

FIG. 1 illustrates a typical thin film magnetic recording transducer 10. As shown, the transducer 10 comprises a plurality of various layers that have been deposited on a nonmagnetic substrate 11. In practice a relatively large plurality of transducers are fabricated on a ceramic substrate and then the substrate is diced to produce air bearing head sliders with transducers deposited over an insulation layer 13 formed thereon. As shown the major components of the transducer 10 comprises a magnetic yoke 12 and a read-write coil 14. The yoke 12 is formed with two pole pieces P1 and P2. The pole pieces include pole tips which are disposed parallel to each other and spaced to define a recording gap 16. The opposite ends of the pole pieces are joined in the back closure region 18.

Figure 6:
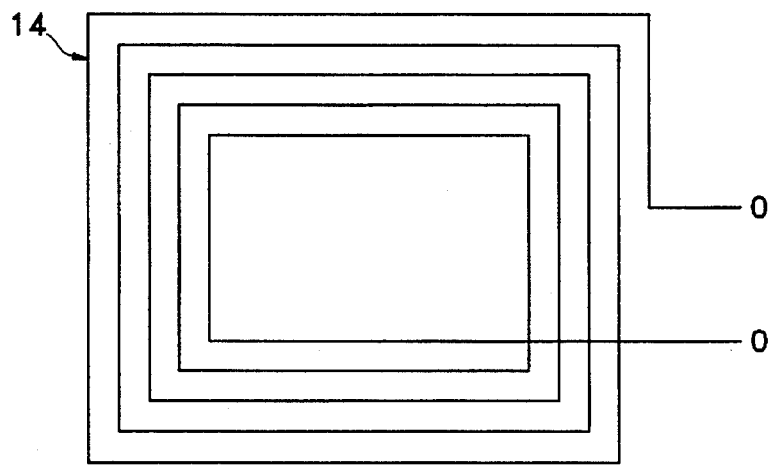
FIG. 6 is a plan view of the pattern employed in constructing the coil shown in FIG. 1.

The read write coil 14 comprises a spiral pattern having a plurality of turns which pass through the window between the pole pieces P1 and P2 of the yoke 12. The ends O—O of the continuous coil structure shown in the plan view of the coil in FIG. 6 are connectable to head circuitry and read-write electronics of the recording system associated with the transducer.

Figure 2:
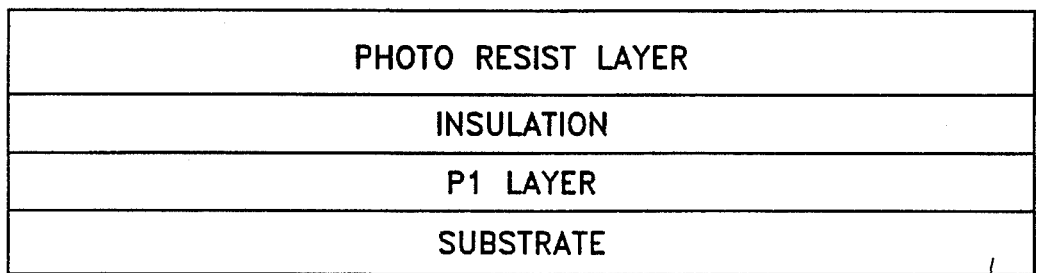
FIG. 2 is an enlarged cross-sectional representation showing various layers of a thin film magnetic recording transducer manufactured in accordance with the present invention.
Figure 3:
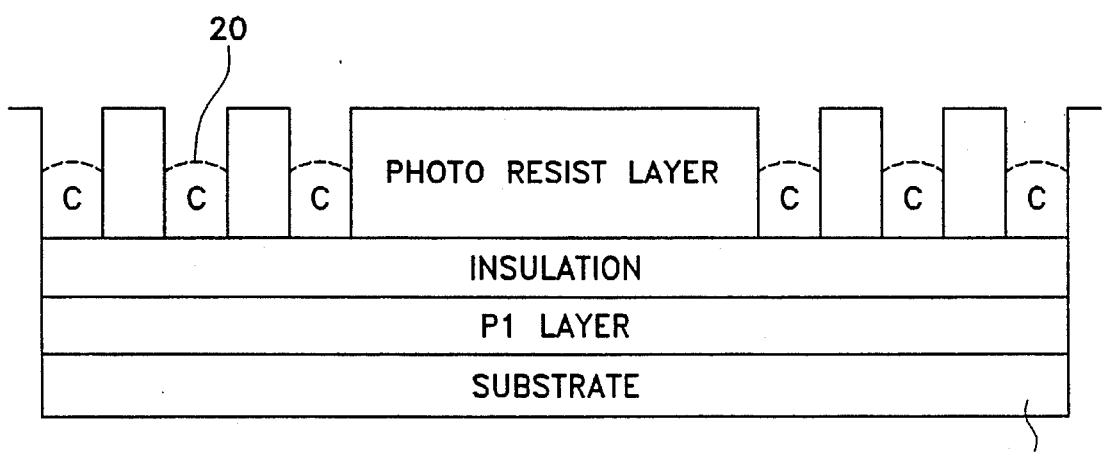
FIG. 3 is an enlarged cross-sectional representation showing the patterning and formation of the lower section of the coil structure and delineating the depth of the lower coil section in a patterned groove.

FIGS. 2–5 illustrate the steps of the process of producing the bi-level coil 14. In production, a layer of photoresist material is deposited to a given depth as shown in FIG. 2 to accommodate the overall height of the bi-level coil. The photoresist is then patterned by well known masking and photolithography steps to produce a multi-turn spiral trench having a rectangular cross-section. The next step of the process is to plate the lower section of the bi-level coil to a depth of approximately one-half the depth of the trench, as shown in FIG. 3. The resist material that defines the spiral trench is then subjected to a conventional curing process.

In keeping with this invention, a masking layer is then deposited over the left half of the lower coil section 20 without disturbing the trench pattern on the right side of the lower coil section. After masking the left half of the coil, a second coil plating step occurs which deposits coil material in the open trench on top of the right half portion of coil material deposited initially in the first plating step. The mask material and the cured photoresist material are then stripped away to produce the bi-level coil structure. A layer of insulating material is subsequently deposited over the turns of the coil, after which the transducer is finished by completing the steps of the process involving the upper yoke member.

Figure 4:
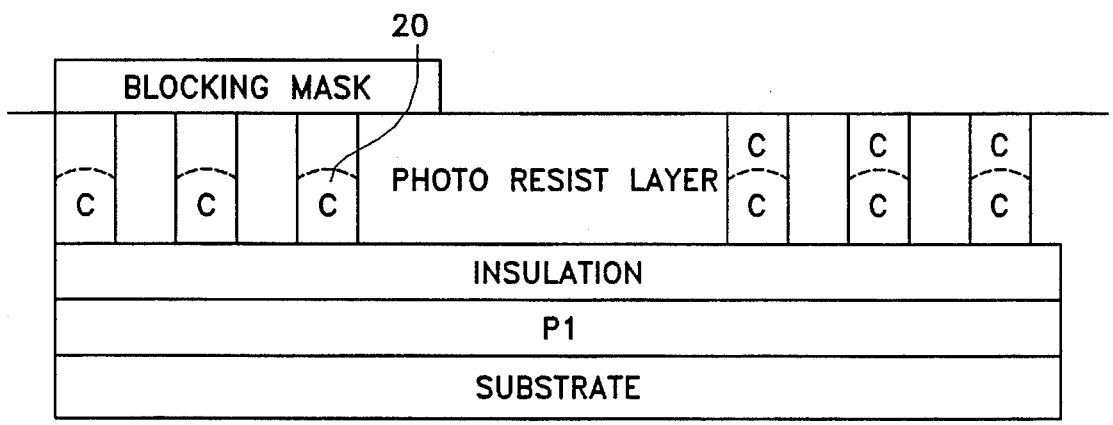
FIG. 4 is an enlarged cross-sectional representation showing the use of a blocking mask to form the partial upper coil section.
Figure 5:
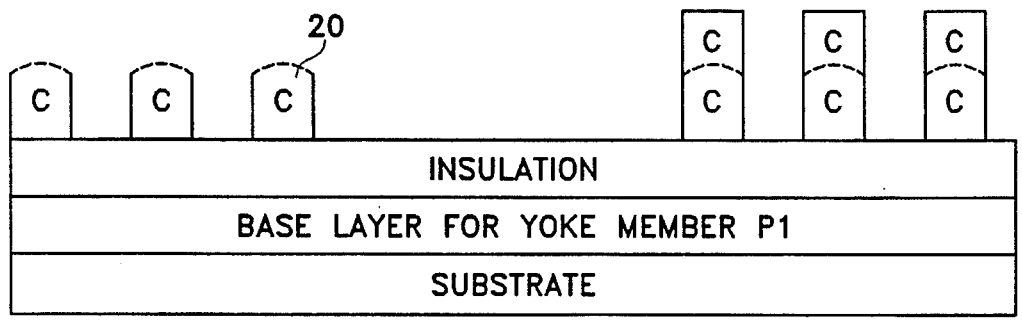
FIG. 5 depicts the structure of FIG. 4 without the blocking mask and with the photoresist layer removed.

As shown in FIGS. 4 and 5, the turns in the right half of the coil are approximately twice the height of the coils in the left hand section. Since the two plating steps are performed at different times but employ the same coil pattern, the portions of the turns of the lower coil section 20 and the upper coil section 22 that are plated at different times are effectively self-aligned and are coextensive. The alignment of the mask which blocks off the left half of the coil is not critical to the successful operation of the transducer. Potential errors affecting transducer performance are eliminated so that overall yields are improved.

What is claimed is:

1. A method of making a bi-level coil structure for a thin film magnetic transducer comprising the steps of:

depositing photoresist material on a base to a level that defines a height of said bi-level coil structure;

forming a patterned groove in said photoresist material, said patterned groove having a depth substantially equal to said height of said bi-level coil structure;

depositing a coil by plating conductive material in said groove to a level about the midpoint of the depth of said groove;

curing said photoresist material;

locating a blocking mask over a portion of said deposited coil, so that another portion of said deposited coil remains exposed;

plating a conductive material over the exposed portion of said deposited coil to a level substantially at the top of said groove so that said bi-level coil structure is formed as a continuous single coil of varying thickness; and depositing insulation material over said bi-level coil structure.

2. A method of manufacturing a bi-level electrical coil disposed between first and second magnetic layers of a magnetic yoke in a thin film magnetic transducer comprising the steps of:

depositing a layer of photoresist material to a level that defines a height of said bi-level coil, after forming said first magnetic layer of said magnetic yoke and depositing an insulating layer thereover;

patterning a first coil section on said photoresist layer including the step of defining a trench in said photoresist layer by dissolving portions of said photoresist, said trench having a depth substantially equal to said height of said bi-level coil;

plating the patterned first coil section in said trench to a level less than the depth of said trench;

curing said photoresist material that defines said trench;

depositing a masking layer over a portion of said trench which contains said first coil section, and exposing another portion of said trench;

plating a patterned second coil section over the exposed portion of said trench until the height of said second coil section is at a level that substantially coincides with the top of said trench, said first and second coil sections forming a continuous coil structure of varying thickness;

dissolving the cured photoresist to expose said bi-level coil structure;

depositing said second magnetic layer above said coil sections with insulation between said magnetic layer and said coil sections.

* * * * *